United States Patent [19]

Bowden et al.

[11] Patent Number: 4,657,841

[45] Date of Patent: Apr. 14, 1987

[54] ELECTRON BEAM SENSITIVE POSITIVE RESIST COMPRISING THE POLYMERIZATION PRODUCT OF AN ω-ALKENYLTRIMETHYL SILANE MONOMER WITH SULFUR DIOXIDE

[75] Inventors: Murrae J. S. Bowden, Summit; Antoni S. Gozdz, Princeton, both of N.J.

[73] Assignee: Bell Communications Research, Inc., Livingston, N.J.

[21] Appl. No.: 791,775

[22] Filed: Oct. 28, 1985

[51] Int. Cl.[4] ........................ G03C 1/495; G03C 5/16

[52] U.S. Cl. .................................... 430/270; 430/296; 430/942; 430/326; 430/311; 430/331; 528/30; 528/32

[58] Field of Search .................... 528/30, 32; 430/270, 430/296, 942, 326, 311, 331

[56] References Cited

U.S. PATENT DOCUMENTS 3,223,686 12/1965 Natta et al. ....................... 528/32 X
3,893,127 7/1975 Kaplan et al. ....................... 430/296
3,898,350 8/1975 Gipstein et al. ..................... 430/296
4,396,702 8/1983 Desai et al. ......................... 430/296

OTHER PUBLICATIONS

Julius Grant, ed, *Hackh's Chemical Dictionary [American and British Usage]*, Third Edition, McGraw-Hill Book Company, Inc., New York, N.Y., 1944, p. 17.

*Primary Examiner*—John E. Kittle
*Assistant Examiner*—Cynthia Hamilton
*Attorney, Agent, or Firm*—James W. Falk; Edward M. Fink

[57] ABSTRACT

Poly(alkenyltrialkylsilane sulfone)s have been found to be electron beam sensitive and suitable for use as positive resists in a two layer resist system. The described resists are prepared by the polymerization of an ω-alkenyltrimethylsilane with sulfur dioxide with or without a second solubilizing olefinic compound. The resultant composition evidences high sensitivity, excellent resolution characteristics and excellent resistance to oxygen reactive-ion etching.

8 Claims, No Drawings

ELECTRON BEAM SENSITIVE POSITIVE RESIST COMPRISING THE POLYMERIZATION PRODUCT OF AN ω-ALKENYLTRIMETHYL SILANE MONOMER WITH SULFUR DIOXIDE

This invention relates to electron-beam-sensitive positive resists. More particularly, the present invention relates to poly(alkenyltrialkylsilane sulfone)s which are electron-beam sensitive and are suitable for use as positive resists in a two-layer resist system.

The continuing trend toward higher resolution and smaller feature sizes in integrated circuitry has led to the development of multilayer resist processing techniques which are designed to achieve submicron resolution on topographical features. Heretofore, a variety of organosilicon polymers, such as the polysiloxanes and the polysilanes, have been used for this purpose, either as the imaging layer and subsequent portable conformable mask in a two-layer system, or as an intermediate etch barrier in a three-layer system. Interest in these materials for resist use has been premised upon their outstanding dry-etching resistance which results from the formation of a thin protective layer of refractory silicon dioxide at the surface of the polymer upon exposure to reactive oxygen species. It is this resistance to plasma etching that is a major requirement for high-resolution lithography, particularly in two-layer applications.

Although patterns have been generated in these resists and transferred with high aspect ratios into the thick planarizing layer of a two-layer resist, workers in the art have encountered difficulty in attaining the required sensitivity to either electron beams or mid-ultraviolet radiation. This limitation is particularly prevalent with positive resists.

In recent years, the foregoing limitation was thought to be overcome by the use of poly(olefin sulfone)s, e.g., poly(1-butene sulfone), which evidence high sensitivity and excellent resolution characteristics. In fact, the high sensitivity of poly(1-butene sulfone) and its excellent overall lithographic performance have made it one of the most widely used commercial resists for chromium mask making. Unfortunately, its lack of resistance to various plasmas has precluded its use in other applications. Thus, for example, it has been reported that poly(1-butene sulfone) etches seven times faster than polystyrene under comparable oxygen reactive-ion etching conditions.

More recently, industrial researchers have reported that the incorporation of silicon-containing units into a poly(olefin sulfone) chain markedly enhances resistance to an oxygen plasma without adversely affecting sensitivity. More specifically, there is described in U.S. Pat. No. 4,396,702, issued on Aug. 2, 1983, a method for forming a positive patterned layer on a substrate bearing a positive-acting polymeric resist material wherein the resist material comprises a copolymer having repeating units of the formula

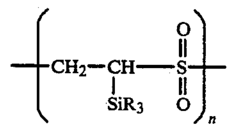

wherein R is a lower alkyl group and n is an integer.

These compositions were prepared by free radical polymerization of the unsaturated silane monomer with sulfur dioxide in the presence of a conventional polymerization initiator. The resultant copolymer was then dissolved in suitable organic solvents and coated upon a substrate by conventional techniques such as casting, spraying, spin coating, etc.

Unfortunately, efforts to duplicate the patented procedure described in the literature have not met with success since the product, which could only be obtained in low yield, was found to be insoluble. Alternative procedures to copolymerize vinyltrimethyl silane with sulfur dioxide were developed subsequently, but the resultant product was found to be quite unstable because of the cleavage, of the trimethyl silyl group, leaving an insoluble residue and so precluding its use as a resist.

In accordance with the present invention, the limitations encountered in the preparation of poly(olefin sulfone)s containing silicon are effectively obviated by a processing sequence wherein an ω-alkenyltrimethylsilane monomer, in which the trimethyl group is separated from the main chain by at least one methylene unit or similar spacer group, is polymerized with sulfur dioxide with or without a second solubilizing olefinic compound, so resulting in the formation of a soluble stable polymer which is capable of forming uniform films when spin-coated from various organic solvents.

More specifically, the resists described herein are prepared by the polymerization of an ω-alkenyltrimethylsilane of the formula

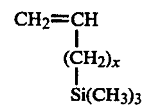

wherein x is an integer greater than or equal to 1, with sulfur dioxide, but when x is 1, a second solubilizing olefin is employed, said solubilizing olefin being selected from the group consisting of (a) ω-alkenyltrimethylsilanes having $x \geqq 2$ (b) cyclic olefins, or (c) olefins of the formula $$CH_2{=}C(R_1)(R_2)$$

wherein $R_1$ represents H or $CH_3$, and $R_2$ represents a straight chain hydrocarbon having from 2 to 6 carbon atoms.

The polymeric compositions described herein are prepared by conventional free-radical polymerization via initiation with ultraviolet radiation, with free-radical thermal initiators or with redox initiators via reaction of sulfur dioxide with t-butylhydroperoxide. The molecular weight of the polymeric composition formed is controlled by temperature and olefin concentration and for ultraviolet initiation by light intensity or in the case of chemical initiation by the initiator concentration with increased amonts giving lower molecular weights.

The monomeric components or their precursors from which the polymeric materials described herein were prepared may be obtained from commercial sources.

1-butene and sulfur dioxide are available in purified form and may be used without further purification.

A brief description of the preparation of the positive resists described herein will now be given.

Initially, monomers that are liquid at room temperatures such as the ω-alkenyltrimethylsilanes or 2 methyl-1-pentene are advantageously passed through neutral alumina prior to use to remove oxidation products and then distilled directly into the reaction vessel. Gaseous monomers such as sulfur dioxide or 1-butene are condensed directly into the reaction flask at temperatures lower than their boiling points, typically at dry ice-acetone temperatures (−78° C.). It has been determined that when x is equal to 1 in the silane formula, the additional solubilizing olefinic compound must be present in the resulting terpolymer in an amount greater than 25 percent based upon the total mole fraction of olefin present to obtain a desired soluble polymer. However, when x is equal to 2, an additional solubilizing olefin is not needed since the homopolysulfone is intrinsically soluble.

Following condensation, the resultant solution is transferred by vacuum distillation into a suitable vessel, sealed under vacuum and maintained at the desired polymerization temperature while being stirred. Initiation of polymerization is effected either by ultraviolet radiation at a wavelength less than 365 nanometers or by the addition of a chemical initiator. Polymerization is terminated after the desired degree of conversion is attained, which may be determined visually by noting the viscosity of the reaction mixture. The reaction vessel is then cooled below the boiling point of sulfur dioxide and opened. The viscous polymer solution so obtained is then diluted with a suitable solvent such as acetone, precipitated, into methanol or other suitable non-solvent, washed and dried.

The polymers so obtained are now ready for application to a suitable substrate. This end is attained by first dissolving the polymer in a suitable organic solvent and depositing a coating thereof upon a substrate surface by conventional techniques, for example, spraying, spin-coating and the like. The resist solution typically contains from 2 to 5 percent, by weight, of polymer. Suitable solvents should evidence a boiling point below the decomposition point of the polymer, thereby permitting expeditious removal of the solvent from the coating by heat or vacuum drying. When the solvent is removed, there remains a uniform resist film of the polymer on the substrate. The polymer films are deposited upon the substrate to the desired thickness, typically 200 to 500 nm. Following, the resist films of the polymer prepared as described are selectively irradiated with, for example, an electron beam, so resulting in degradation of the polymer in irradiated areas. Irradiation is effected in an electron beam exposure system which is capable of delivering doses ranging from 0.5 to 2.0 $\mu C/cm^2$ at 20 kv. Typical of the exposure system employed for such purposes is the EBES electron beam exposure system. Next, the exposed resist is developed by conventional dipping or spraying techniques. Positive resist action requires a developer (solvent) which dissolves only the irradiated portion of the film. Suitable solvents for this purpose include, for example, an alcohol such as amyl alcohol either alone or in combination with other ketone or ester solvents such as 3-methyl-2 pentanone or amyl acetate.

The removal of the irradiated portion of the resist leaves a positive pattern on the substrate which can serve as a mask for subsequent pattern transfer.

Although the sensitivity and resolution of the described resist are important factors, it is the ability of the resist to protect the underlying substrate during oxygen reactive-ion etching, that is the most critical property required for two-layer lithographic applications. During reactive-ion etching, the resist is exposed to reactive oxygen species and various forms of radiative energy present in the plasma, i.e., conditions which normally lead to the rapid degradation of poly(olefin sulfone)s. The oxygen plasma resistance of the resists described herein has been found to be considerably higher than that of poly(olefin sulfone)s, so resulting in their suitability for two-layer resist processes which employ oxygen reactive-ion etching pattern transfer techniques.

Examples of the practice of the present invention are set forth hereinbelow. It will be appreciated by those skilled in the art that these examples are set forth solely for purposes of exposition and are not to be construed as limited.

EXAMPLE ONE

This example describes the preparation of an electron beam sensitive resist wherein allyltrimethylsilane was copolymerized with 1-butene and sulfur dioxide.

14.6 Millimoles of allyltrimethylsilane, 41.9 millimoles of 1-butene and 5,540 millimoles of sulfur dioxide were condensed in a calibrated cylinder at −70° C. and transferred by vacuum distillation into a 500 milliliter Pyrex glass flask equipped with a magnetic stirring bar. The flask was then sealed under vacuum and placed in a refrigerated bath set at the desired polymerization temperature (−20° C.). Polymerization was initiated by a 1 mW ultraviolet lamp which was placed in a quartz well adjacent to the monomer-containing ampoule. Polymerization was terminated after the desired degree of conversion had been attained as judged from visual observation of solution viscosity and the ampoule cooled below the boiling point of sulfur dioxide (−10° C.) and opened. The polymer so obtained was then processed and its lithographic characteristics evaluated.

A solution comprising 2–4 weight percent of terpolymer in cyclopentanone was prepared and deposited by conventional spin coating techniques in a thickness of 300 nanometers upon a silicon substrate which had been previously coated with 1.2 μm of hard baked novolac-based photo resist. The substrate was then baked at 120° C. for one hour. Following, the resist was exposed in an Electron Beam Exposure System (EBES) to a dose of 1.5 microcoulombs per square centimeter at 20 keV. Then, the exposed resist was developed by dipping the substrate in a solution of amyl alcohol and amyl acetate at a temperature of 20° C. Following, the substrate was rinsed with amyl alcohol and baked for one hour at 120° C. The sensitivity of the resist at 20 keV was 1.5 microcoulombs per square centimeter and the contrast was approximately two. The oxygen reactive-ion etching resistance and pattern transfer performance of the described resist was evaluated using a commercially available reactive-ion etching system with an oxygen flow rate of 15 sccm at a pressure of 20–50 mTorr with an rf power of 0.2 watts per square centimeter and a negative bias of 300 V. It was observed that the thickness of the polymer decreased by 5–30 percent during 10–15 minute reactive-ion etching which is sufficient to remove the novolac-based planarizing layer. Analysis by scanning Auger electron spectroscopy revealed a thin layer of silicon dioxide upon a partially degraded poly(olefin sulfone).

The dry etching resistance of the polymer was found to be sensitive to the oxygen reactive-ion etching conditions, but excellent pattern transfer into the planarizing layer was obtained.

EXAMPLE TWO

This example describes the preparation of a resist wherein allyltrimethylsilane was copolymerized with 2-methyl-1-pentene and sulfur dioxide in the presence of tertiary butyl hydroperoxide.

39 Millimoles of allyltrimethylsilane, 39 millimoles of 2-methyl-1-pentene and 1100 millimoles of sulfur dioxide were condensed in a Schlenk flask at −70° C. The flask was then placed in a refrigerated bath set at −70° C. and the contents stirred by means of a magnetic stirrer. Following, 0.3 milliliters of tertiary butyl hydroperoxide was injected into the flask through a rubber septum in the side arm of the flask by means of a gas-tight syringe. The desired degree of polymerization was attained within thirty minutes. The reaction vessel was then opened and the resultant viscous polymer diluted with acetone to a concentration of approximately 1 percent. The polymer was next precipitated into a five-fold excess of rapidly stirred methanol, filtered through a glass frit, washed with methanol and air dried. The polymer was then redissolved in acetone, again precipitated into methanol and air dried. The polymer yield was 68.3 percent (48.3 percent allyltrimethylsilane). The lithographic performance and reactive-ion etching behavior of the polymer were comparable to that observed for the resist described in Example One.

EXAMPLE THREE

This example describes the preparation of a resist wherein 3-butenyltrimethylsilane was copolymerized with sulfur dioxide.

3-Butenyltrimethylsilane obtained by the reaction of allyl bromide with trimethylsilylmethyl magnesium chloride was passed through neutral alumina to remove oxidation products and then condensed with sulfur dioxide in a 50 ml Pyrex glass ampoule using vacuum line techniques. The monomers were degassed by a series of freeze-thaw cycles and the ampoule sealed under vacuum. Then the ampoule was placed next to a nitrogen-flushed quartz well equipped with a 1 mW Pen-Ray UV lamp and polymerization initiated as discussed in Example One. After irradiation for one hour at −20° C., the ampoule was opened, the reaction mixture diluted with 100 ml of acetone and poured slowly into 500 ml of rapidly stirred methanol. The resultant white, powdery product was separated on a filter, washed with several portions of fresh methanol and dried in air to constant weight. The product was purified by re-precipitation from a diluted acetone solution into methanol and dried in air. The yield was 1.83 grams (46.4 percent).

Thin films of poly(3-butenyltrimethylsilane sulfone) were spun on silicon wafers from a 3.5 percent solution of the copolymer in cyclopentanone followed by baking at 110° C. for 1 hour. The wafers were exposed to a 20 keV electron beam using an EBES-1 system with individual test patterns exposed to doses from 0.3 to 3 $\mu C/cm^2$. The patterns were developed by dipping the wafers in amyl alcohol at 14° C. for 100 seconds followed by a rinse in isopropyl alcohol, a drying cycle in a stream of dry air and post-baking at 120° C. for 1 hour. Under these conditions, the sensitivity to a 20 keV electron beam was 1.0 to 1.5 $\mu C/cm^2$ and contrast ranged from 1.8 to 2.3.

What is claimed is:

1. Method for formation of a positive patterned layer upon a substrate which comprises the steps of
   (a) coating the substrate with a composition obtained by the polymerization of ω-alkenyltrimethylsilane of the formula

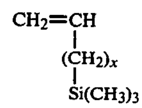

wherein x is an integer greater than or equal to 1, and when x is one, a second solubilizing olefin with sulfur dioxide, said solubilizing olefin being selected from the group consisting of
   (1) ω-alkenyltrimethylsilanes having $x \geqq 2$
   (2) cyclic olefins, or
   (3) olefins of the formula $$CH_2{=}C(R_1)(R_2)$$

wherein $R_1$ represents hydrogen or a methyl group and $R_2$ represents a straight chain hydrocarbon having from 2 to 6 carbon atoms
   (b) irradiating selected portions of said composition, and
   (c) removing the irradiated portions of said medium with a suitable developing solvent.

2. Method in accordance with claim 1 wherein said solubilizing olefin is 2 methyl-1-pentene.

3. Method in accordance with claim 1 wherein said solubilizing olefin is 1-butene.

4. Method in accordance with claim 1 wherein the polymerization is effected by free-radical initiation.

5. Method in accordance with claim 1 wherein x is 1 and the solubilizing olefin is present in an amount greater than 25 percent based upon the total mole fraction of olefin present.

6. Method in accordance with claim 1 wherein x is 2.

7. Method in accordance with claim 1 wherein development of the irradiated portions of the substrate is effected with amyl alcohol either alone or in combination with ketone or ester solvents.

8. Electron beam sensitive positive resist comprising the polymerization product of ω-alkenyltrimethylsilane of the formula

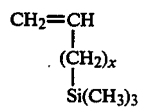

wherein x is an integer greater than or equal to 1, with sulfur dioxide and when x is one, a second solubilizing olefin, said solubilizing olefin being selected from the group consisting of
   (a) ω-alkenyltrimethylsilane having $x \geqq 2$
   (b) cyclic olefins, or
   (c) olefins of the formula

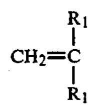
wherein $R_1$ represents hydrogen or a methyl group and $R_2$ represents a straight chain hydrocarbon having from 2 to 6 carbon atoms.
* * * * *
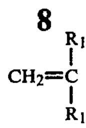
wherein $R_1$ represents hydrogen or a methyl group and $R_2$ represents a straight chain hydrocarbon having from 2 to 6 carbon atoms.
* * * * *

UNITED STATES PATENT AND TRADEMARK OFFICE

CERTIFICATE OF CORRECTION

PATENT NO. : 4,657,841

DATED : April 14, 1987

INVENTOR(S) : Murrae J. S. Bowden and Antoni S. Gozdz

It is certified that error appears in the above-identified patent and that said Letters Patent is hereby corrected as shown below:

Column 1, line 21, "barrier in" should read --barrier layer in--. Column 2, line 43 "≥" should read -->--. Column 2, line 65, "amonts" should read --amounts--. Column 6, line 21 ">" should read --≥--. Column 6, line 66 "≥" should read --≥--. Column 8, lines 1 through 7 should be deleted.

Signed and Sealed this

Nineteenth Day of January, 1988

*Attest:*

DONALD J. QUIGG

*Attesting Officer* *Commissioner of Patents and Trademarks*